US008581193B2

(12) United States Patent
Dinh et al.

(10) Patent No.: US 8,581,193 B2
(45) Date of Patent: *Nov. 12, 2013

(54) HIDDEN SENSORS IN AN ELECTRONIC DEVICE

(71) Applicant: Apple Inc., Cupertino, CA (US)

(72) Inventors: Richard Hung Minh Dinh, San Jose, CA (US); Christopher T. Mullens, San Francisco, CA (US); Ching Yu John Tam, Los Gatos, CA (US); Brian Q. Huppi, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/679,444

(22) Filed: Nov. 16, 2012

(65) Prior Publication Data

US 2013/0075613 A1 Mar. 28, 2013

Related U.S. Application Data

(63) Continuation of application No. 12/242,909, filed on Sep. 30, 2008, now Pat. No. 8,324,578.

(51) Int. Cl.
*G01J 5/02* (2006.01)
*H04M 1/00* (2006.01)

(52) U.S. Cl.
USPC ..................... 250/339.06; 455/566

(58) Field of Classification Search
USPC ......... 250/339.05, 339.06, 358.1, 360.1, 200, 250/206, 336.1, 372, 370.01; 368/10; 455/566

See application file for complete search history.

(56) References Cited

U.S. PATENT DOCUMENTS

| 6,541,775 | B2 | 4/2003 | Yagi |
| 6,894,270 | B2 | 5/2005 | Bailey |
| 7,569,825 | B2 | 8/2009 | Kamijo |
| 2005/0230596 | A1 | 10/2005 | Howell et al. |
| 2006/0065859 | A1 | 3/2006 | Lapstun et al. |
| 2007/0241261 | A1 | 10/2007 | Wendt |
| 2009/0152445 | A1 | 6/2009 | Gardner, Jr. |
| 2010/0053861 | A1 | 3/2010 | Kim et al. |

*Primary Examiner* — David Porta
*Assistant Examiner* — Faye Boosalis
(74) *Attorney, Agent, or Firm* — Van Court & Aldridge LLP

(57) ABSTRACT

An electronic device having one or more sensors is provided. The sensors may include any suitable type of sensor that emits or receives radiation (e.g., light waves) from the environment. The electronic device may include openings through which radiation may reach the sensors while keeping the sensors hidden from view. In some embodiments, the sensors may be placed underneath an opening used for an audio receiver such that radiation is piped to the sensors using a light path or a chamfered surface along the opening. In some embodiments, the sensors may be embedded in a screen such that the radiation emitted by the sensors exits the screen instead of being reflected on the screen. In some embodiments, the sensors may be placed along the periphery of the display, such that access to the sensors is provided via discontinuities in a gasket used to couple the display to the electronic device.

28 Claims, 4 Drawing Sheets

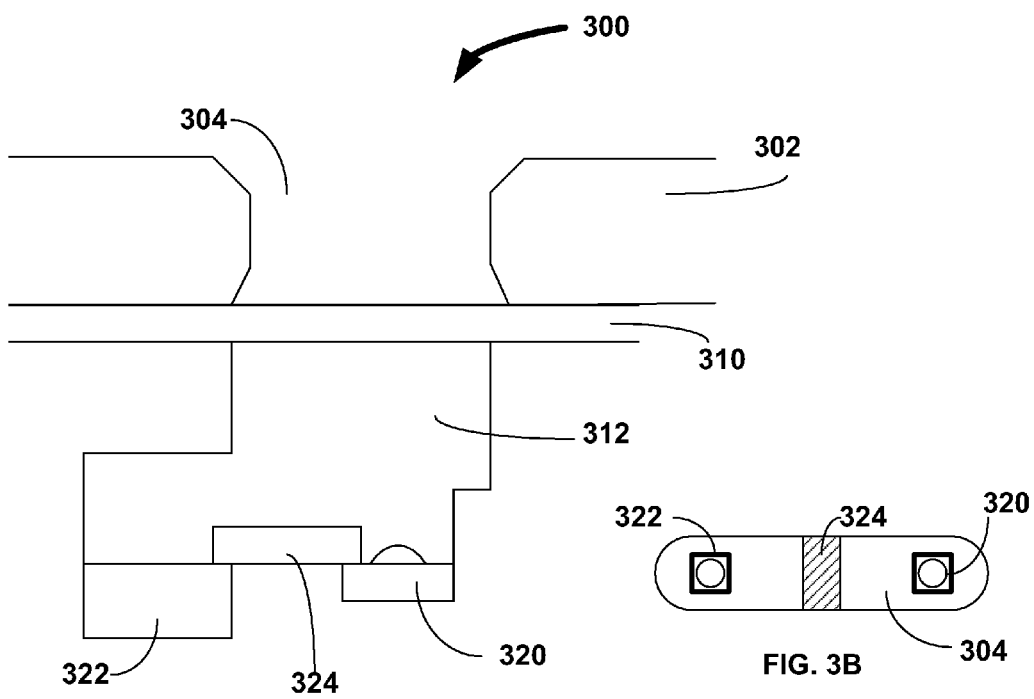
FIG. 3A
FIG. 3B
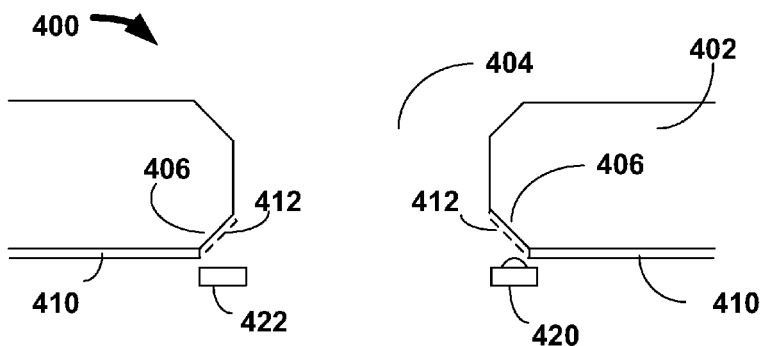
FIG. 4A
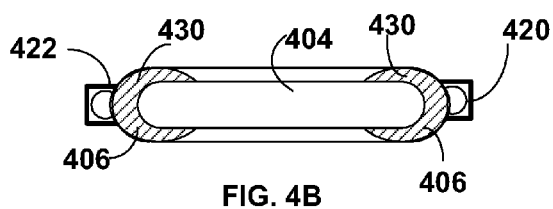
FIG. 4B

HIDDEN SENSORS IN AN ELECTRONIC DEVICE

CROSS-REFERENCE TO RELATED APPLICATIONS

This application is a continuation of U.S. patent application Ser. No. 12/242,909, filed Sep. 30, 2008 (now U.S. Pat. No. 8,324,578), which is hereby incorporated by reference herein in its entirety.

BACKGROUND OF THE INVENTION

Many different approaches may be used to enable electronic devices to interact with users. For example, an electronic device may include a display on which information may be made available to a user. As another example, an electronic device may include one or more input mechanisms by which a user may provide inputs to the device. As still another example, an electronic device may include sensors for detecting the environment or events in the vicinity of a user. In response to detecting a particular event, the electronic device may perform an associated operation.

The electronic device may include any suitable type of sensor. For example, the electronic device may include a proximity sensor, an ambient light sensor (ALS), a pressure sensor, a light or infra-red sensor, or any other suitable sensor. In some embodiments, the sensor may include a radiation source for emitting radiation (e.g., a light or sound wave) and a receiver for detecting the emitted radiation. To emit or receive radiation, however, the electronic device may include one or more apertures through which the radiation may propagate. For example, the electronic device may include a first aperture through which radiation (e.g., light from a light emitting diode) may be emitted, and a second aperture through which the emitted radiation may be detected.

The apertures, however, may not be aesthetically pleasing and may call attention away from the aesthetically pleasing features of the electronic device. It would be desirable, therefore to provide apertures required for sensors in a manner that is aesthetically pleasing, or in a manner that hides one or more of the apertures.

SUMMARY OF THE INVENTION

An electronic device having sensors hidden from view is provided.

In some embodiments, an electronic device having at least one sensor for detecting the environment of the electronic device may be provided. The electronic device may include an audio receiver and an opening for emitting audio generated by the audio receiver through the opening. An audio mesh covering the opening may also be provided, for example to hide components within the opening from view or to prevent debris from entering within the opening. The electronic device may include a first sensor positioned underneath the opening and operative to emit radiation, and a second sensor positioned underneath the opening and operative to detect radiation. The first sensor may be placed adjacent to the second sensor. The electronic device may also include a divider positioned between the first and second sensors and operative to prevent radiation emitted by the first sensor from being detected by the second sensor without exiting the electronic device (e.g., through the opening).

In some embodiments, an electronic device having at least one sensor for detecting the environment of the electronic device may be provided. The electronic device may include an audio receiver and an opening for emitting audio generated by the audio receiver through the opening. The opening may include at least two portions with a chamfered edge, to which infrared paint may be applied (e.g., to direct infrared light along the edge of opening). The electronic may include a first sensor positioned adjacent to the first portion with the chamfered edge and operative to emit radiation, and a second sensor positioned adjacent to the second portion with the chamfered edge and operative to detect radiation.

In some embodiments, an electronic device having at least one sensor for detecting the environment of the electronic device may be provided. The electronic device may include a housing and a display that includes several light sources operative to illuminate to provide content to a user. For example, the electronic device may include a light emitting diode (LED), liquid crystal display (LCD), organic LED, or any other suitable light source or display type. The electronic device may also include at least one sensor embedded among the plurality of LEDs of the display, such that radiation (e.g., infrared light) may pass through the display to the at least one sensor.

In some embodiments, an electronic device having at least one sensor may be provided. The electronic device may include a bezel and a display coupled to the bezel such that the bezel is positioned around the periphery of the display. A gasket may be positioned between the bezel and the display, for example to retain the display within the bezel using a press fit. The electronic device may include at least one sensor placed underneath the display and at least one opening in the gasket between the bezel and the display such that the opening provides access to the at least one sensor. A light pipe may be coupled to the opening to propagate radiation between the environment and the at least one sensor.

BRIEF DESCRIPTION OF THE DRAWINGS

The above and other features of the present invention, its nature and various advantages will be more apparent upon consideration of the following detailed description, taken in conjunction with the accompanying drawings in which:

FIGS. 2A and 2B are cross-sections of illustrative windows in an electronic device display that includes a mask in accordance with one embodiment of the invention;

FIG. 3A is a cross-sectional view of an illustrative electronic device in which sensors are positioned underneath an audio receiver aperture in accordance with one embodiment of the invention;

FIG. 3B is a top view of the electronic device of FIG. 3A in accordance with one embodiment of the invention;

FIG. 4A is a cross-sectional view of an electronic device in which one or more sensors are positioned at the edge of an audio receiver aperture in accordance with one embodiment of the invention;

FIG. 4B is a top view of the electronic device of FIG. 4A in accordance with one embodiment of the invention;

DETAILED DESCRIPTION

An electronic device having sensors for detecting the user's environment is provided. To hide the sensors from view and provide a more aesthetically pleasing device, different approaches may be used to hide the windows through which the sensors may receive radiation (e.g., light or sound waves). In some embodiments, the sensors may use existing windows of the device, for example windows associated with an audio receiver, to allow radiation to propagate to and from the sensors. For example, the sensors may be positioned underneath an audio receiver window of a display and connected to the window via a light path operative to direct light through the window and to and from the sensors. As another example, the window may include a chamfered edge operative to direct light or other radiation from the environment to a particular location behind the window. The chamfered edge may be operative to direct the light to one or more sensors positioned underneath the window, adjacent to the chamfered edge. In some embodiments, the window may include several distinct chamfered edges each associated with distinct sensors.

In some embodiments, one or more sensors may be embedded in the screen of an electronic device. For example, if the electronic device includes and LED, OLED or LCD screen, one or more sensors (e.g., sensors using LEDs) may be embedded among the light sources of the screen to emit or detect radiation (e.g., light waves) to or from the environment. The screen may include one or more light pipes operative to direct radiation between the sensors and the environment. In other embodiments, one or more sensors may be embedded adjacent to the boundary between a bezel (e.g., part of a housing) and the display. To prevent debris or particles from damaging electronic device components, a gasket may be placed between the bezel and the display. To provide access to the sensors located adjacent to the bezel-display boundary, the gasket may include localized openings forming light pipes between the environment and the sensors. The light pipes may have any suitable dimension, including for example dimensions selected based on the sensors used and the type of radiation detected or emitted by the sensors.

Figure 1:
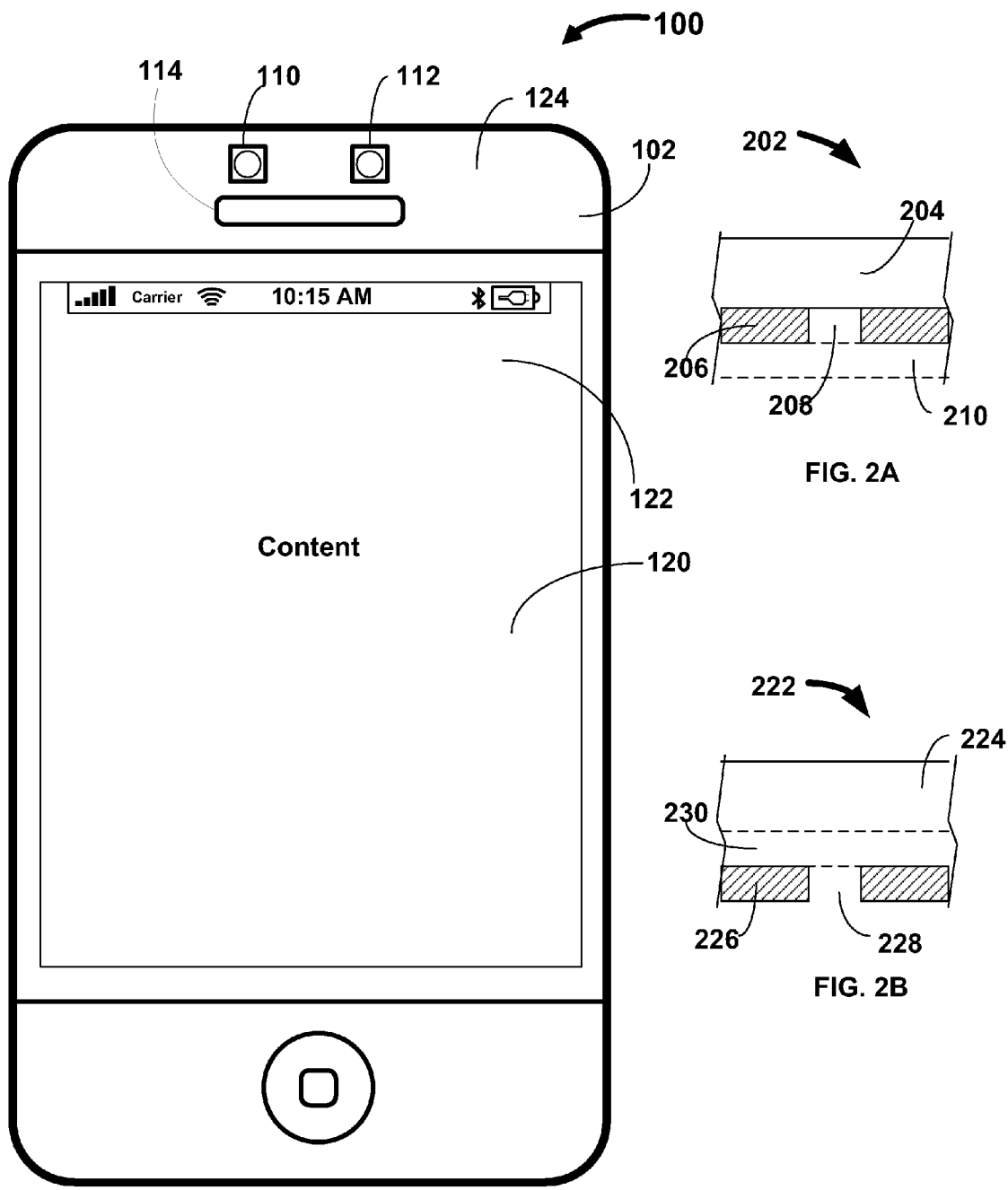
FIG. 1 is a schematic view of an illustrative electronic device having several apertures for sensors in accordance with one embodiment of the invention.

FIG. 1 is a schematic view of an illustrative electronic device having several apertures for sensors in accordance with one embodiment of the invention. Electronic device 100 may include bezel 102 and display 120 retained within bezel 102. Display 120 may be coupled to bezel 102 using any suitable approach. For example, display 120 may include a chamfer, or be coupled to a tab operative to engage an overhang in bezel 102. Display 120 may include screen 122 operative to provide information to a user. Screen 122 may include any suitable type of screen, including for example an LCD or LED screen. Electronic device 100 may include opening 114 through which audio may be provided by an audio component (e.g., a speaker), for example for performing telephone conversations or listening to audio. Electronic device 100 may also include windows 110 and 112 through which a sensor output may be projected (e.g., through window 110) and detected (e.g., through window 112).

Electronic device 100 may include any suitable type of sensor, including for example an electromagnetic sensor (e.g., RADAR), gas and liquid flow sensors, position sensors, optical sensors, acoustic sensors, or any other suitable type of sensors that detect radiation in the electronic device. In some embodiments, an electronic device may include a proximity sensor having two components. For example, the proximity sensor may include an emitter (e.g., an infrared LED) and a receiver or detector (e.g., an infrared receiver) for detecting radiation (e.g., infrared light). As another example, the electronic device may instead or in addition include an ambient light sensor (e.g., a photocell). Electronic device 110 may include any suitable number of windows, and windows having any suitable size based on the number and type of sensors used for electronic device 100.

To hide windows 110 and 112 from view, portion 124 of display 120 (e.g., portions of display 120 that are not positioned over screen 122) may be darkened or include a mask. The mask may prevent all radiation or light (e.g., including radiation associated with sensors) from passing, and therefore only be applied to sections of portion 124 other than windows 110 and 112 (e.g., sections of portion 124 that are not adjacent to the sensors). Alternatively, an opening in a mask covered in IR paint may prevent light in the visible spectrum from passing through windows 110 and 112, but may allow radiation at other wavelengths (e.g., infra-red or ultra-violet light) to pass, and may therefore be applied to the entirety of portion 124.

To at least partially hide windows 110 and 112 from view, infrared ink may be applied to the display 120 at windows 110 and 112. Infrared ink may have low transmissivity of the visual light spectrum (e.g., to prevent a user from seeing windows 110 and 112), but high transmissivity of the infrared spectrum (e.g., allowing infrared light to be emitted or detected by sensors underneath windows 110 and 112). FIGS. 2A and 2B are cross-sections of illustrative windows in an electronic device display that includes a mask in accordance with one embodiment of the invention. Electronic device 202 may include display 204, mask 206 and infrared ink 210, such that mask 206 is positioned between display 204 and infrared ink 210. Window 208 may be provided in mask 206 to allow radiation to pass through the display and out of or into electronic device 202. Mask 206 may be constructed from darkened material to hide the components behind display 204 from view. For example, mask 206 may include an opaque material (e.g., a black material), such as a plastic, composite material, metal, thin film, or any other suitable material. Infrared ink 210 may be applied to the bottom surface of mask 206 to assist in the transmission of radiation (e.g., waves) through window 210 and screen 204.

Electronic device 222 may include display 224, infrared ink 230 and mask 226, such that infrared ink 230 is positioned between display 224 and mask 226. Infrared ink 230 may be applied to the bottom surface of mask 226 to assist in the transmission of radiation (e.g., waves) through window 230 and screen 224. Window 228 may be provided in mask 226 to allow radiation to pass through the display and out of or into electronic device 222. Mask 226 may be constructed from darkened material to hide the components behind display 224 from view. For example, mask 226 may include an opaque material (e.g., a black material), such as a plastic, composite material, metal, thin film, or any other suitable material.

Although the approaches depicted in FIGS. 2A and 2B may provide mechanism for masking portions of a display while providing windows for one or more sensors, these approaches require windows in the display in addition to the audio opening (e.g., opening 114) that a user would expect to see. Other approaches may therefore be used to provide ports for one or more sensors using existing openings within the display. FIG. 3A is a cross-sectional view of an illustrative electronic device in which sensors are positioned underneath an audio receiver aperture in accordance with one embodiment of the invention. FIG. 3B is a top view of the electronic device of FIG. 3A in accordance with one embodiment of the invention. Electronic device 300 may include opening 304 in display 302. For example, opening 304 may include an elongated opening through which audio emitted by an audio receiving component of the device may be provided to the user. Electronic device 300 may include audio mesh 310 placed underneath opening 304, which may include any suitable type of mesh operative to allow audio waves to pass through. In some embodiments, the holes of audio mesh 310 may be sized so as to prevent debris or fragments other from passing through opening 304 and impairing or destroying audio components or other sensors placed within opening 304, but also to allow audio waves and other waves generated by or detected sensors.

Electronic device 300 may include tunnel 312 (e.g., forming a light pipe) located underneath mesh 310 through which radiation emitted from or detected by a sensor may be ported. Tunnel 312 may have any suitable dimension, including substantially the dimensions of opening 304. Alternatively, or in addition, the dimensions of tunnel 312 may be selected based on the size of the radiation waves that are expected to propagate within electronic device 300. The audio receiver or audio components providing audio output may be coupled to tunnel 312 using any suitable approach, including for example a secondary tunnel, or in a different plane than that shown in FIG. 3A.

Sensors 320 and 322 may be positioned at the end of tunnel 312 to emit or detect radiation. In some embodiments, sensors 320 and 322 may be positioned within the projection of the periphery of opening 304 (e.g., sensors 320 and 322 are visible when looking straight into opening 304 when mesh 310 is removed). Sensors 320 and 322 may include any suitable sensors. For example, sensor 320 may include an infrared receiver and sensor 322 may include an infrared emitter forming a proximity sensor. Sensor 322 may emit infrared radiation that propagates through audio mesh 310, reflects off of the environment back through audio mesh 310, and is received or detected by sensor 320. To prevent radiation emitted by sensor 322 from passing directly to sensor 320 without first passing through audio mesh 310 and into the environment, divider 324 may be positioned between sensors 320 and 322. Divider 324 may have any suitable size, and for example extend up to audio mesh 310 or a feature (e.g., an overhang) of tunnel 312.

FIG. 4A is a cross-sectional view of an electronic device in which one or more sensors are positioned at the edge of an audio receiver aperture in accordance with one embodiment of the invention. FIG. 4B is a top view of the electronic device of FIG. 4A in accordance with one embodiment of the invention. Electronic device 400 may include screen 402 having opening 404. Opening 404 may include chamfer 406, which may be constructed as part of a lozenge or rhombus. The size and angle of chamfer 406 may be selected to form a light pipe operative to direct radiation around the periphery of opening 404 (e.g., to or from the environment). To help direct radiation around chamfer 406, infrared ink 412 may be applied to chamfer 406. Mask 410 may be applied to the bottom surface of screen 402 (e.g., away from chamfer 406) to hide from view the electronic device components placed underneath screen 402. The chamfer and other details or features of opening 404 may hide the transition between infrared ink 412 and mask 410.

Electronic device 400 may include sensors 420 and 422 positioned underneath chamfer 406, for example at opposite ends of opening 404. Sensors 420 and 422 may include any suitable sensor, including for example the sensors of FIGS. 3A and 3B. As sensor 422 emits radiation, the radiation may be guided along chamfer 406 and out of opening 404 into the environment. Radiation returning to opening 404 may be gathered along chamfer 406 and directed, using infrared ink 412 to sensor 420. Zones 430 adjacent to the ends of opening 404, where infrared ink 412 is applied, may be the areas of screen 402 where radiation may be detected or emitted.

Figure 5:
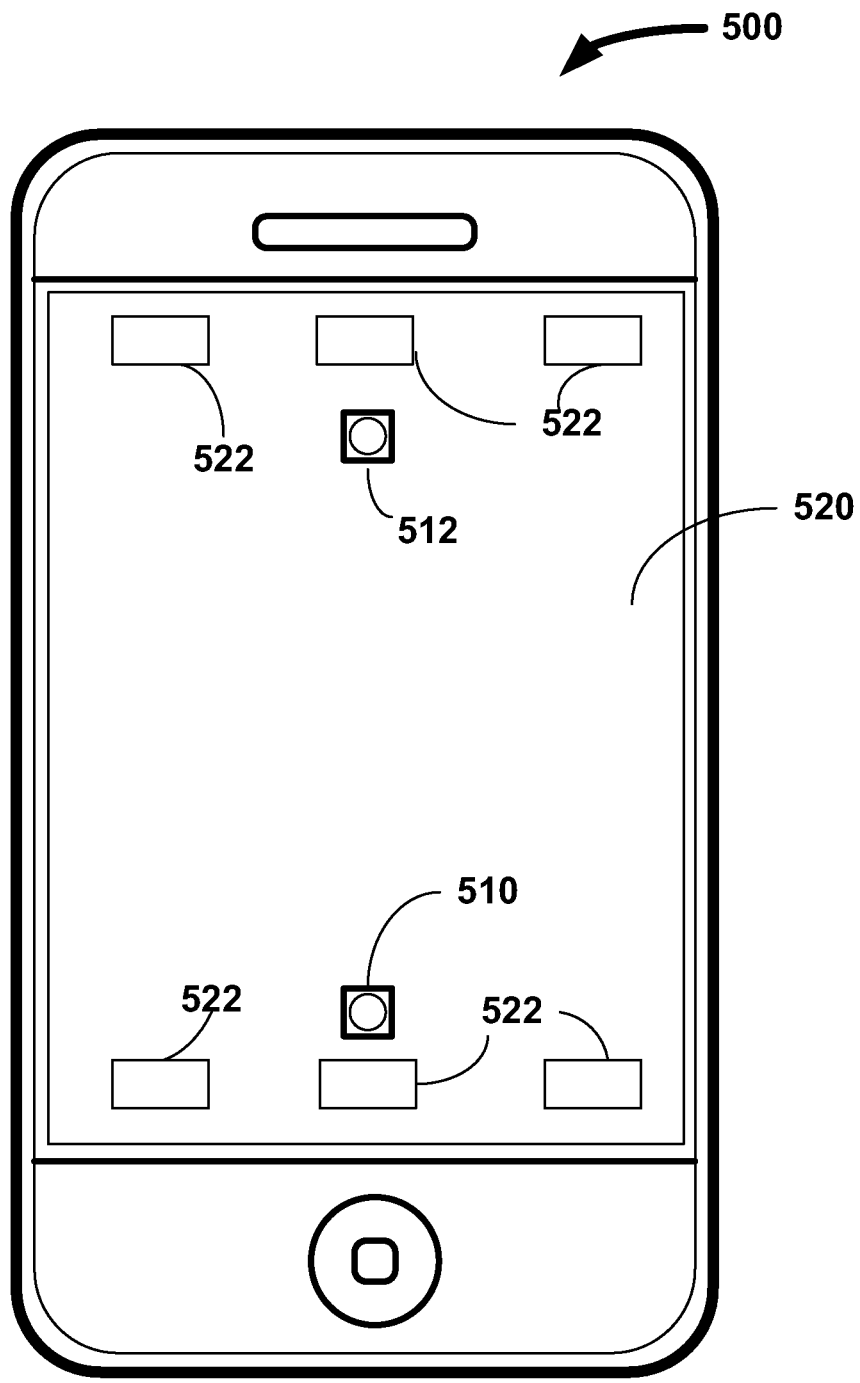
FIG. 5 is a schematic view of an illustrative electronic device having sensors embedded in a screen in accordance with on embodiment of the invention.

FIG. 5 is a schematic view of an illustrative electronic device having sensors embedded in a screen in accordance with one embodiment of the invention. Electronic device 500 may include screen 520 for providing content to a user. Content may be generated by a processor within the electronic device and provided on a display. To illuminate the display, backlight LEDs 522 may emit light at particular frequencies, for example using one or more light pipes to direct the emitted light.

In some embodiments, sensors 510 and 512 may be embedded among LEDs 522 in screen 520 for detecting features or events in the environment. Sensors 510 and 512 may include any suitable sensor, including for example the sensors of FIGS. 3A and 3B. Screen 520 may include one or more alternative light pipes to direct radiation, such as infrared radiation emitted by sensor 512, out of display 520 and towards the environment. The radiation emitted by sensor 512 may reflect off of the environment, for example off of the user, and return towards display 520. Display 520 may include one or more light pipes operative to direct radiation received from the environment towards sensor 510 for detection. By embedding sensors 510 and 512 in display 520, the sensors may be hidden from view to the user. In some embodiments, the sensor readings may be time multiplexed with backlight LEDs 522 so that the backlight created by the LEDs does not interfere with the sensors. To further reduce the visibility of the sensors, the light pipes used to direct the radiation may be distributed along different portions of screen 520 to minimize the effect of the light pipes on the displayed content.

Figure 6:
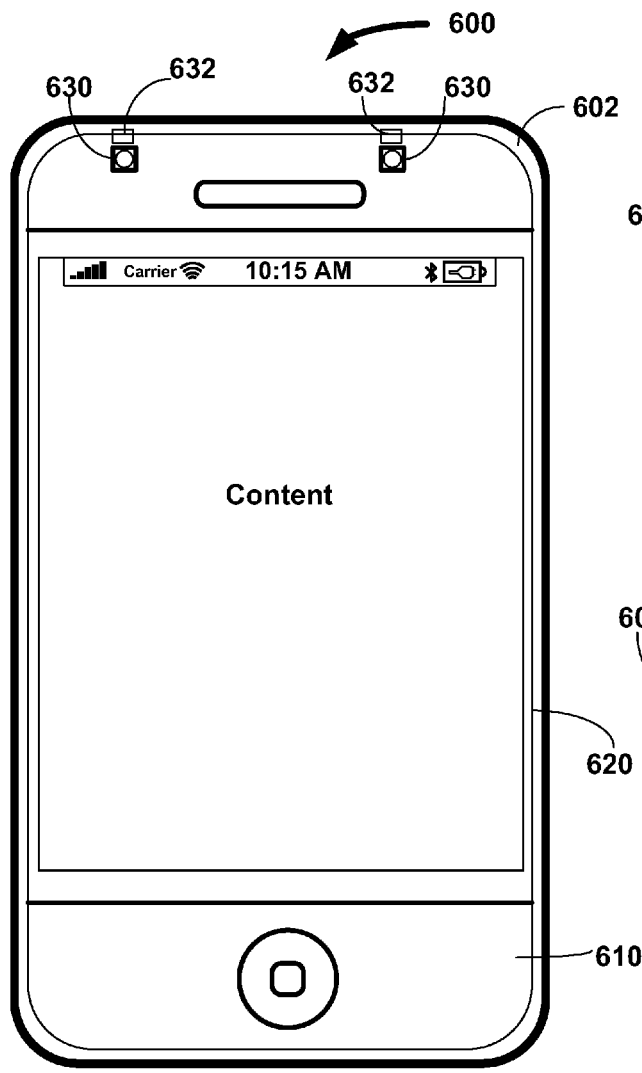
FIG. 6 is a schematic view of an illustrative electronic device having a sensor embedded between a display and a bezel in accordance with one embodiment of the invention.
Figure 7A:
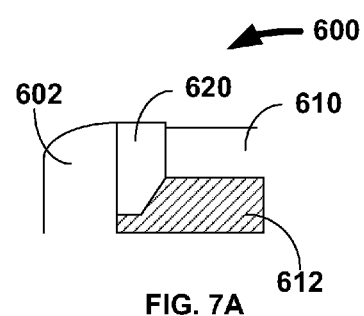
FIG. 7A is a cross-sectional view of the electronic device of FIG. 6 along a section having a gasket in accordance with one embodiment of the invention.
Figure 7B:
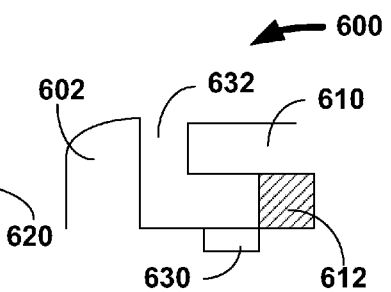
FIG. 7B is a cross-sectional view of the electronic device of FIG. 6 along a section having a light pipe in accordance with one embodiment of the invention.

FIG. 6 is a schematic view of an illustrative electronic device having a sensor embedded between a display and a bezel in accordance with one embodiment of the invention. FIG. 7A is a cross-sectional view of the electronic device of FIG. 6 along a section having a gasket in accordance with one embodiment of the invention. FIG. 7B is a cross-sectional view of the electronic device of FIG. 6 along a section having a light pipe in accordance with one embodiment of the invention. Electronic device 600 may include display 610 coupled to bezel 602 using gasket 620. Display 610 may be supported from within the electronic device by support 612, which may extend under some or all of display 610. Gasket 620 may provide a seal between bezel 602 and display 610 to ensure that debris and other particles do not damage display 610 or components within electronic device 600 (e.g., as shown in FIG. 7A). Gasket 620 may have any suitable width, including for example less than 0.5 mm.

Electronic device 600 may include sensors 630 operative to detect features of the environment. Sensors 630 may include any suitable type of sensors, including for example the sensors of FIGS. 3A and 3B (e.g., an infrared emitter and an infrared receiver). To provide sensors 630 with access out of the electronic device, gasket 620 may include a local opening (e.g., gasket 620 may be locally removed) in areas adjacent to sensors 630 to provide light pipe 632 through which radiation emitted or received by sensors 630 may propagate. The dimensions and shape of light pipe 632 may be selected based on any suitable criteria, including for example based on size and expected propagation pattern of radiation emitted or received by sensor 630, the location of sensor 630 within light pipe 632, the size of possible debris that could enter light pipe 632, or any other suitable criteria. For example, the dimensions of light pipe 632 may be selected to enable light having particular frequencies or wavelengths (e.g., infrared light) to enter light pipe 632 and propagate to sensor 630.

The above-described embodiments of the invention are presented for purposes of illustration and not of limitation, and the present invention is limited only by the claims which follow.

What is claimed is:

1. An electronic device comprising:
    an audio opening;
    an emitter positioned underneath the audio opening and configured to emit first radiation through the audio opening into an environment of the electronic device; and
    a receiver positioned adjacent to the emitter and configured to receive second radiation through the audio opening from the environment.

2. The electronic device of claim 1, wherein the audio opening comprises a speaker opening.

3. The electronic device of claim 1, wherein the emitter comprises an infrared light emitting diode ("LED").

4. The electronic device of claim 3, wherein the receiver comprises an infrared detector.

5. The electronic device of claim 1, wherein the emitter is separated from the receiver by a divider.

6. The electronic device of claim 1 further comprising an audio mesh positioned between a portion of the audio opening and at least one of the emitter and the receiver.

7. The electronic device of claim 1, wherein the receiver is positioned adjacent to the emitter in a direction that is orthogonal to a direction of at least one of the emission of the first radiation and the receipt of the second radiation.

8. A display comprising:
    a plurality of light emitting diodes ("LEDs");
    at least one sensor embedded among the plurality of LEDs; and
    at least one light pipe configured to direct at least one of:
        first radiation received from an environment of the display to the at least one sensor; and
        second radiation emitted by the at least one sensor to the environment.

9. The display of claim 8, wherein the at least one light pipe extends through the display.

10. The display of claim 8, wherein the at least one light pipe couples the at least one sensor to the environment.

11. The display of claim 8, wherein the at least one sensor comprises a receiver configured to receive the first radiation from the environment.

12. The display of claim 11, wherein the receiver comprises an infrared detector.

13. The display of claim 11, wherein the at least one sensor further comprises an emitter configured to emit the second radiation to the environment.

14. The display of claim 13, wherein the emitter comprises an infrared light emitting diode ("LED").

15. The display of claim 13, wherein the receiver and the emitter are positioned such that the receiver does not receive the second radiation emitted by the emitter from within the display.

16. An electronic device comprising:
    a bezel;
    a display positioned adjacent the bezel and configured to display content in a first direction; and
    at least one sensor positioned underneath a portion of the display and configured to one of:
        emit first radiation to an environment of the electronic device in the first direction via an opening between the bezel and the display; and
        receive second radiation from the environment in a second direction that is opposite the first direction via the opening.

17. The electronic device of claim 16, wherein the at least one sensor is positioned away from the opening.

18. The electronic device of claim 16, wherein the opening comprises a light pipe for passing any one of the emitted first radiation and the received second radiation.

19. The electronic device of claim 16, wherein the at least one sensor comprises an emitter configured to emit infrared radiation.

20. The electronic device of claim 19, wherein the at least one sensor further comprises a receiver configured to receive infrared radiation.

21. A method of manufacturing an electronic device, the method comprising:
    providing a plurality of windows through a display;
    positioning a radiation source adjacent to a first window of the plurality of provided windows;
    situating a radiation sensor adjacent to a second window of the plurality of provided windows; and
    masking at least a portion of the display to hide each of the positioned radiation source, the situated radiation sensor, and the plurality of provided windows from view.

22. The method of claim 21, wherein the situating further comprises situating the radiation sensor adjacent to the positioned radiation source.

23. The method of claim 21, wherein:
    the display comprises a screen portion and a peripheral portion; and
    the providing comprises providing each window of the plurality of windows through a respective section of the peripheral portion.

24. The method of claim 23, wherein the masking comprises applying a mask over an entirety of the peripheral portion, wherein the applied mask comprises a plurality of infrared-painted openings that each corresponds to a respective window of the plurality of provided windows.

25. The method of claim 21, wherein the positioning further comprises orienting the radiation source such that radiation emitted by the radiation source can travel through the first window into an environment of the electronic device.

26. The method of claim 25, wherein the situating further comprises orienting the radiation sensor such that the radiation sensor can receive the emitted radiation from the environment through the second window.

27. The method of claim 21, wherein the masking comprises darkening the at least a portion of the display.

28. The method of claim 21, wherein the masking comprises masking only a predefined area of the display that surrounds the plurality of provided windows.

* * * * *